US012660356B2

(12) United States Patent
Fang et al.

(10) Patent No.: US 12,660,356 B2
(45) Date of Patent: Jun. 16, 2026

(54) DOUBLE-LAYER STACKED CMOS IMAGE SENSOR

(71) Applicant: Shanghai Huali Microelectronics Corporation, Shanghai (CN)

(72) Inventors: Xing Fang, Shanghai (CN); Chenchen Qiu, Shanghai (CN); Jun Qian, Shanghai (CN); Chang Sun, Shanghai (CN); Zhengying Wei, Shanghai (CN)

(73) Assignee: Shangai Huali Microelectronics Corporation, Shanghai (CN)

( * ) Notice: Subject to any disclaimer, the term of this patent is extended or adjusted under 35 U.S.C. 154(b) by 375 days.

(21) Appl. No.: 18/449,231

(22) Filed: Aug. 14, 2023

(65) Prior Publication Data

US 2024/0128296 A1    Apr. 18, 2024

(30) Foreign Application Priority Data

Oct. 18, 2022    (CN) .......................... 202211273937.7

(51) Int. Cl.
H10F 39/00          (2025.01)
(52) U.S. Cl.
CPC .................................. H10F 39/809 (2025.01)

(58) Field of Classification Search
CPC ............................... H10F 39/809; H10F 39/18
See application file for complete search history.

(56) References Cited

U.S. PATENT DOCUMENTS

2009/0219422 A1*  9/2009  Takeuchi ............. H04N 25/618
                                                          348/300
2023/0268372 A1*  8/2023  Hsu ................... H10F 39/80373
                                                          257/292

* cited by examiner

*Primary Examiner* — Tucker J Wright
(74) *Attorney, Agent, or Firm* — Quarles & Brady LLP

(57)          ABSTRACT
The present application discloses a double-layer stacked CMOS image sensor, photo diode and transfer gate transistor of a pixel cell are formed on the first substrate sequentially along a longitudinal direction, and the other pixel transistors of the pixel cell are formed on the second substrate. The first substrate and the second substrate are packaged separately, and the second substrate is stacked on the top side of the first substrate instead of being in juxtaposition. Since the photo diode and the pixel transistors other than the transfer gate transistor of the pixel cell are located on two separate substrates respectively, the area of a photo diode region may be increased significantly, thereby greatly increasing full well capacitance of the image sensor and increasing a dynamic range, and reduce a dark current and image noise significantly, thereby improving the dark line noise and full well capacitance simultaneously.

6 Claims, 3 Drawing Sheets

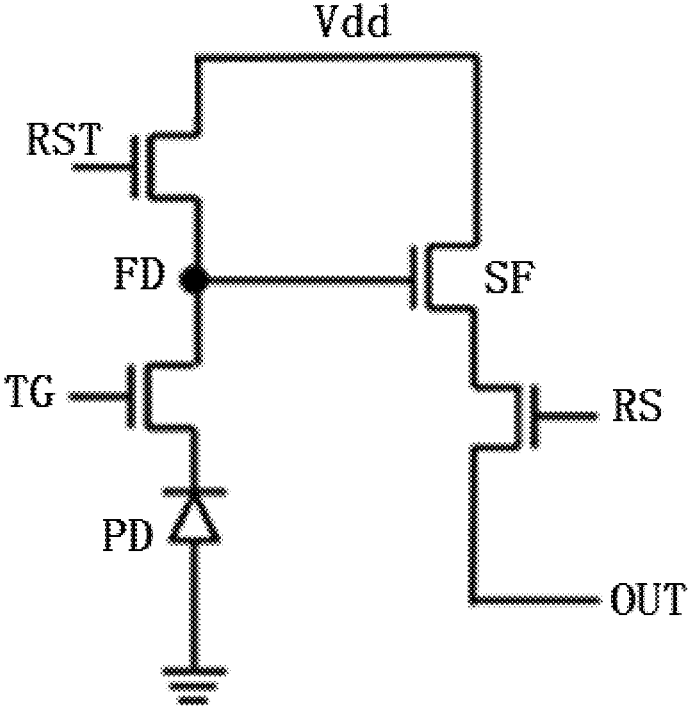
FIG 1--Prior Art--
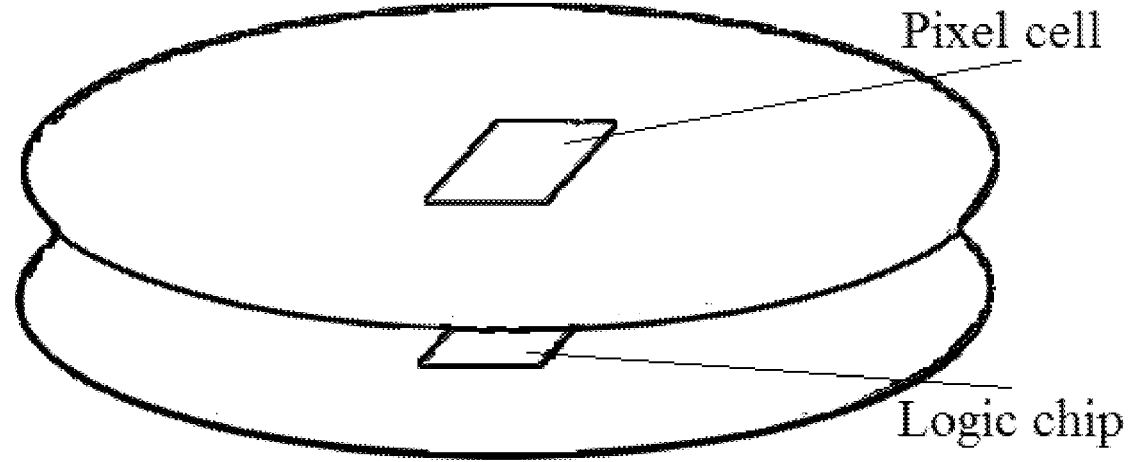
FIG. 2--Prior Art--

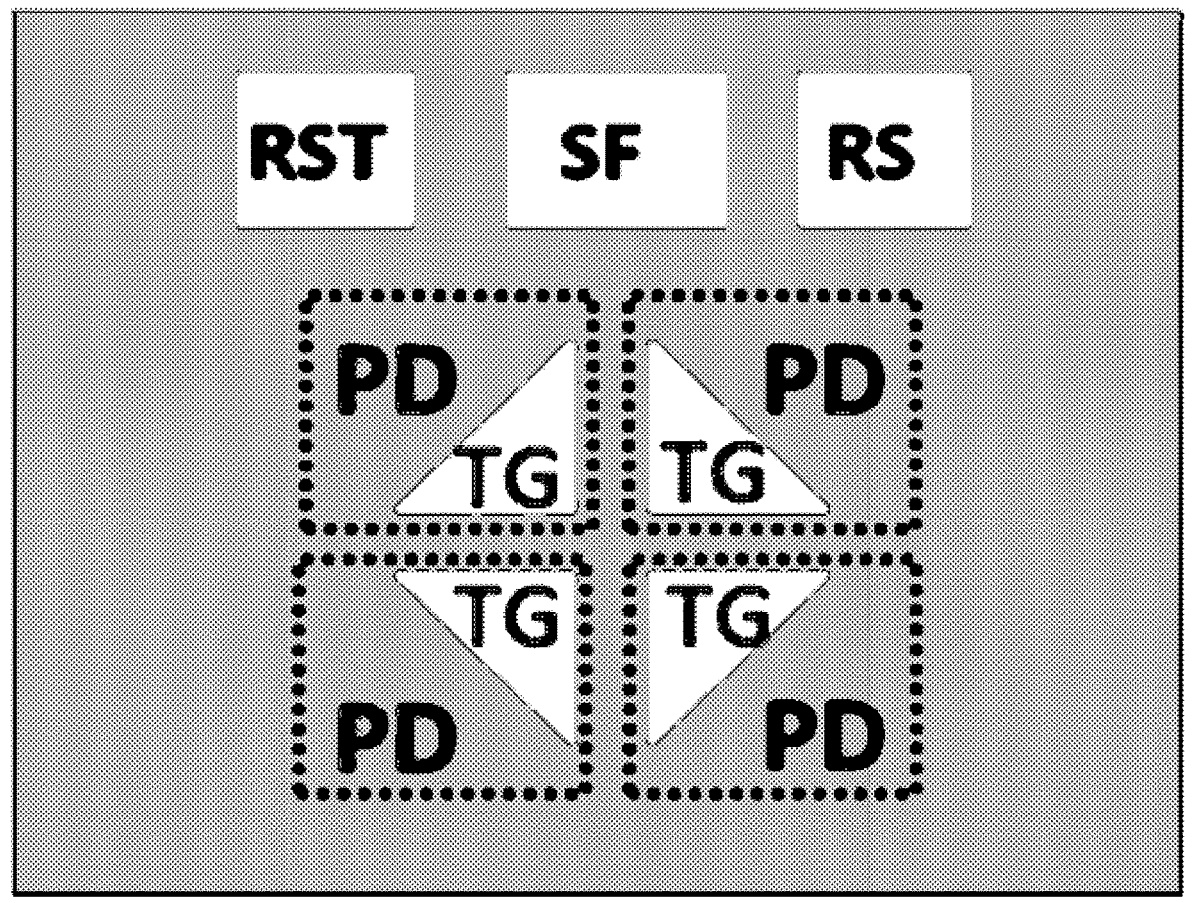
FIG. 3--Prior Art--

1

DOUBLE-LAYER STACKED CMOS IMAGE SENSOR

CROSS-REFERENCES TO RELATED APPLICATIONS

This application claims priority to Chinese patent application No. CN202211273937.7 filed on Oct. 18, 2022, and entitled "DOUBLE-LAYER STACKED CMOS IMAGE SENSOR", the disclosure of which is incorporated herein by reference in entirety.

TECHNICAL FIELD

The present application relates to semiconductor manufacturing technologies, in particular to a double-layer stacked CMOS image sensor.

BACKGROUND

An active pixel cell of a CMOS image sensor (CIS) typically includes a photo diode (PD) and a plurality of pixel transistors located in an epitaxial layer. Taking a 4T-structured CMOS image sensor as an example, referring to FIG. 1, four pixel transistors are transfer gate (TG), source follow (SF), reset (RST), and row select (RS) transistors respectively. A basic working principle of the 4T-structured CMOS image sensor is as follows: The photo diode PD functions to achieve a photoelectric conversion; The transfer gate transistor Tx may be understood as a switch used to control the transfer of electrons from the photo diode to a floating diffusion (FD) region, which may be understood as a capacitor used to store electrons generated by the photoelectric conversion. The source follow transistor SF is a switch used to control the transfer of the electrons from the floating diffusion region to a signal line. The reset transistor RST is used to reset a voltage signal in a circuit. The row select transistor RS is a switch used to control the output of a pixel cell signal, and an output sequence of pixel cell signals may be controlled using this switch. Before illumination, the reset transistor and the transfer gate transistor are turned on to release original electrons in a photo diode region. During the illumination, all the transistors are turned off to generate charges in a photo diode space charge region. During reading, the transfer gate transistor is turned on to transfer charges stored in the photo diode region to the floating diffusion region FD. After the transfer, the transfer gate transistor is turned off, waiting for the next time of illumination. A charge signal in the floating diffusion region FD is used subsequently to adjust the source follow transistor, converting the charges into a voltage, and a current is output to an analog-to-digital conversion circuit by the row select transistor.

A current mainstream stacked CMOS image sensor structure includes a logic chip and a pixel chip fabricated respectively on two different silicon wafers (forming a signal processing logic circuit on the logic chip, with the pixel chip stacked on the top of the logic chip), with performances thereof being optimized respectively. A through silicon via (TSV) technology is used for wafer-level interconnection, ultimately forming a double-layer stacked CMOS image sensor chip. Referring to FIG. 1, in each chip, the photo diode PD that converts light into electrical signals and the pixel transistors (TG, SF, RST, RS) that control the signals are adjacent to each other on the same layer. In such arrangement mode of the current mainstream stacked CMOS image sensor structure, on the one hand, the size of a pixel region amplifier (i.e., the source follow transistor SF) is limited, the signal processing capability is limited, the proportion of the photo diode PD region is small, and an overall saturation electrical signal of the image sensor is low, with an insufficient dynamic range. On the other hand, due to the impact of the logic transistor, the image sensor has severe noise. The isolation between a photo diode and a pixel transistor in a small-pixel CMOS image sensor is generally achieved by forming N-P-N using a P-type well, referring to FIG. 3. A main reason for the failure of imaging dark line noise in the CMOS image sensor is an insufficient P-type well isolation width, which results in a poor isolation effect. However, if the P-type well is expanded, an effective area of the photo diode may be reduced because of the squeeze of the P-type well, resulting in a decrease in the full well capacitance. Therefore, the increase of an isolation area using a conventional process method cannot simultaneously improve the dark line noise and full well capacitance, resulting in an insufficient overall performance of the pixel region.

BRIEF SUMMARY

The technical problem to be solved by the present application is to provide a double-layer stacked CMOS image sensor, which can increase full well capacitance of an image sensor significantly, increase a dynamic range, and reduce a dark current and image noise significantly, thereby improving the dark line noise and full well capacitance simultaneously. so that the CMOS image sensor produces less image noise at night and in other dim scenes.

To solve the above technical problem, the double-layer stacked CMOS image sensor provided by the present application is a 4T-structured CMOS image sensor, comprising a pixel cell in which a photo diode PD, a transfer gate transistor TG, and a first floating diffusion region are formed on a first substrate SB1.

The photo diode PD is located at a longitudinal bottom of the first substrate SB1.

The transfer gate transistor TG and the first floating diffusion region are located on a longitudinal top side of the photo diode PD.

The first floating diffusion region is located on lateral circumference of the transfer gate transistor TG.

A source follow transistor SF, a reset transistor RST, a row select transistor RS, and a second floating diffusion region FD2 of the pixel cell are formed on a second substrate SB2.

The first substrate SB1 and the second substrate SB2 are packaged separately.

The second substrate SB2 is stacked on a top side of the first substrate SB1, and the first floating diffusion region and the second floating diffusion region ED2 are connected together by means of a through silicon via to form a floating diffusion region FD of the pixel cell.

In an example, a bottom side of the second substrate SB2 is bonded to the top side of the first substrate SB1.

In an example, longitudinal projections of the first floating diffusion region and the second floating diffusion region FD2 have an overlap region.

In an example, the source follow transistor SF, the reset transistor RST, and the row select transistor RS are laterally arranged and formed on the second substrate SB2.

In an example, the second floating diffusion region ED2 is located on lateral circumference of the source follow transistor SF and the reset transistor RST.

In an example, the area of the source follow transistor SF of the pixel cell is greater than twice the area of the reset transistor RST or the row select transistor RS.

In an example, the area of the source follow transistor SF of the pixel cell is 5-20 times the area of the reset transistor RST or row select transistor RS.

In an example, a signal processing logic circuit of the image sensor is formed on the second substrate SB2.

In the double-layer stacked CMOS image sensor of the present application, the photo diode PD and the transfer gate transistor TG of the pixel cell are formed on the first substrate SB1 sequentially along a longitudinal direction, and the other pixel transistors of the pixel cell are formed on the second substrate SB2. The first substrate SB1 and the second substrate SB2 are packaged separately, and the second substrate SB2 is stacked on the top side of the first substrate SB1 instead of being in juxtaposition. In the double-layer stacked CMOS image sensor, since the photo diode PD and the pixel transistors other than the transfer gate transistor TG of the pixel cell are located on two separate substrates respectively, the area of a photo diode PD region may be increased significantly, thereby greatly increasing full well capacitance of the image sensor (which may be doubled approximately) and increasing a dynamic range. In addition, since the pixel transistors other than the transfer gate transistor TG of the pixel cell are formed on the second substrate SB2, the isolation of the photo diode PD region with respect to only the transfer gate transistor TG and other pixel cells needs to be enhanced, and a P-well isolation width can be increased to improve an isolation effect, thereby reducing a dark current and image noise significantly. Therefore, the double-layer stacked CMOS image sensor can increase the dark line noise and full well capacitance simultaneously, so that the CMOS image sensor produces less image noise at night and in other dim scenes. Moreover, since the transfer gate transistor TG and the photo diode PD are not formed on the substrate where the source follow transistor SF is located, the size of the source follow transistor SF may be increased. By increasing the size of the source follow transistor SF, the optical signal processing capability of the image sensor under dark light may be improved, thus improving the amplification performance of the source follow transistor SF. As such, compared to a conventional image sensor, an overall saturation signal of the image sensor is increased significantly (which can be doubled), thereby expanding the dynamic range, reducing the dark current, and improving the image noise.

BRIEF DESCRIPTION OF THE DRAWINGS

In order to more clearly explain the technical solutions of the present application, the drawings required by the present application will be briefly described below. It is obvious that the drawings described below are merely some embodiments of the present application, and those skilled in the art could also obtain other drawings on the basis of these drawings without the practice of inventive effort.

FIG. 1 is a schematic diagram of a pixel cell of a 4T-structured CMOS image sensor.

FIG. 2 is a schematic diagram of a structure of a current mainstream stacked CMOS image sensor.

FIG. 3 is a schematic diagram of isolation between a photo diode and pixel transistors of a current small-pixel CMOS image sensor.

DETAILED DESCRIPTION OF THE DISCLOSURE

Figure 4:
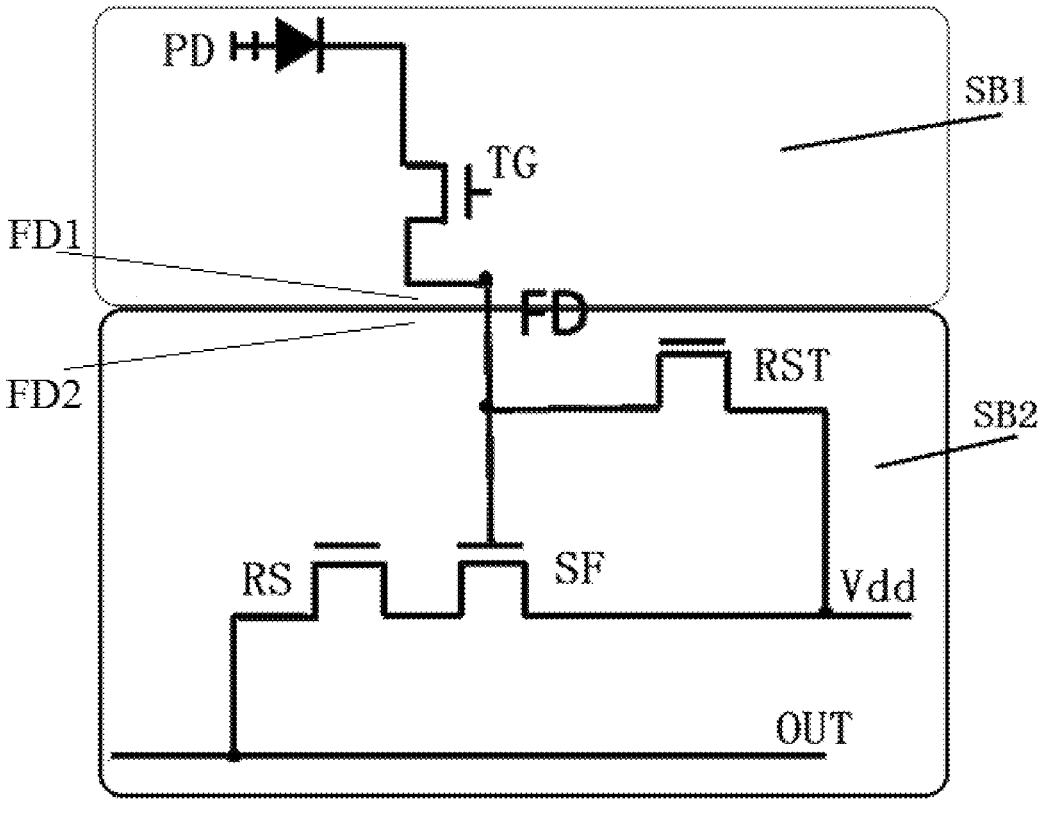
FIG. 4 is a schematic diagram of a double-layer stacked CMOS image sensor according to an embodiment of the present application.

The technical solutions in the embodiments of the present application will be clearly and completely described below in conjunction with the drawings. Obviously, the described embodiments are only part of the embodiments of the present application, rather than all of the embodiments. Based on the embodiments in the present application, all other embodiments obtained by those skilled in the art without the practice of inventive effort shall fall into the protection scope of the present application.

The terms such as "first" and "second" used in the present application do not indicate any order, quantity, or importance, but are only used to distinguish different constituent parts. The terms such as "include" or "comprise" means that the components or objects in front of these terms cover the components or objects listed after the terms and equivalents thereof, without excluding other components or objects. The terms such as "connection" or "coupling" are not limited to physical or mechanical connections, but may include electrical connections, whether direct or indirect. The terms "up", "down", "left", "right", etc. are only used to represent relative positional relationships, which may change accordingly after absolute positions of the described objects change.

It should be noted that the embodiments or features in the embodiments of the present application may be combined with each other in the case of no conflict.

Embodiment 1

Referring to FIG. 4, a double-layer stacked CMOS image sensor is a 4T-structured CMOS image sensor, including a pixel cell in which a photo diode PD, a transfer gate transistor TG, and a first floating diffusion region FD1 are formed on a first substrate SB1.

The photo diode PD is located at a longitudinal bottom of the first substrate SB1.

The transfer gate transistor TG and the first floating diffusion region FD1 are located on a longitudinal top side of the photo diode PD.

The first floating diffusion region FD1 is located on lateral circumference of the transfer gate transistor TG.

A source follow transistor SF, a reset transistor RST, a row select transistor RS, and a second floating diffusion region FD2 of the pixel cell are formed on a second substrate SB2.

The first substrate SB1 and the second substrate SB2 are packaged separately.

The second substrate SB2 is stacked on a top side of the first substrate SB1, and the first floating diffusion region FD1 and the second floating diffusion region FD2 are connected together by means of a through silicon via (TSV) to form a floating diffusion region FD of the pixel cell.

In an example, a bottom side of the second substrate SB2 is bonded to the top side of the first substrate SB1.

In the double-layer stacked CMOS image sensor of Embodiment 1, the photo diode PD and the transfer gate transistor TG of the pixel cell are formed on the first substrate SB1 sequentially along a longitudinal direction, and the other pixel transistors of the pixel cell are formed on the second substrate SB2. The first substrate SB1 and the second substrate SB2 are packaged separately, and the second substrate SB2 is stacked on the top side of the first substrate SB1 instead of being in juxtaposition. In the double-layer stacked CMOS image sensor, since the photo diode PD and the pixel transistors other than the transfer gate transistor TG of the pixel cell are located on two separate substrates respectively, the area of a photo diode PD region may be increased significantly, thereby greatly increasing full well capacitance of the image sensor (which may be doubled approximately) and increasing a dynamic range. In addition, since the pixel transistors other than the transfer gate transistor TG of the pixel cell are formed on the second substrate SB2, the isolation of the photo diode PD region with respect to only the transfer gate transistor TG and other pixel cells needs to be enhanced, and a P-well isolation width can be increased to improve an isolation effect, thereby reducing a dark current and image noise significantly. Therefore, the double-layer stacked CMOS image sensor can increase the dark line noise and full well capacitance simultaneously, so that the CMOS image sensor produces less image noise at night and in other dim scenes. Moreover, since the transfer gate transistor TG and the photo diode PD are not formed on the substrate where the source follow transistor SF is located, the size of the source follow transistor SF may be increased. By increasing the size of the source follow transistor SF, the optical signal processing capability of the image sensor under dark light may be improved, thus improving the amplification performance of the source follow transistor SF. As such, compared to a conventional image sensor, an overall saturation signal of the image sensor is increased significantly (which can be doubled), thereby expanding the dynamic range, reducing the dark current, and improving the image noise.

Embodiment 2

In the double-layer stacked CMOS image sensor based on Embodiment 1, longitudinal projections of the first floating diffusion region FD1 and the second floating diffusion region FD2 have an overlap region.

Embodiment 3

In the double-layer stacked CMOS image sensor based on Embodiment 1, the source follow transistor SF, the reset transistor RST, and the row select transistor RS are laterally arranged and formed on the second substrate SB2.

In an example, the second floating diffusion region FD2 is located on lateral circumference of the source follow transistor SF and the reset transistor RST.

In an example, the area of the source follow transistor SF of the pixel cell is greater than twice the area of the reset transistor RST or the row select transistor RS. For example, the area of the source follow transistor SF of the pixel cell is 5-20 times the area of the reset transistor RST or row select transistor RS.

In an example, a signal processing logic circuit of the image sensor is formed on the second substrate SB2.

The above description is merely examples of the embodiments of the present application and not intended to limit the present application. Any modifications, equivalent substitutions, improvements, etc. made within the spirit and principles of the present application shall be included within the protection scope of the present application.

What is claimed is:

1. A double-layer stacked CMOS image sensor, which is a 4T-structured CMOS image sensor, comprising a pixel cell in which a photo diode (PD), a transfer gate transistor (TG), and a first floating diffusion region (FD1) are formed on a first substrate (SB1); wherein
   the photo diode (PD) is located at a longitudinal bottom of the first substrate (SB1);
   the transfer gate transistor (TG) and the first floating diffusion region (FD1) are located on a longitudinal top side of the photo diode (PD);
   the first floating diffusion region (FD1) is located on lateral circumference of the transfer gate transistor (TG);
   a source follow transistor (SF), a reset transistor (RST), a row select transistor (RS), and a second floating diffusion region (FD2) of the pixel cell are formed on a second substrate (SB2);
   the first substrate (SB1) and the second substrate (SB2) are packaged separately;
   the second substrate (SB2) is stacked on a top side of the first substrate (SB1), and the first floating diffusion region (FD1) and the second floating diffusion region (FD2) are connected together by means of a through silicon via (CT) to form a floating diffusion region (FD) of the pixel cell;
   the area of the source follow transistor (SF) of the pixel cell is greater than twice the area of the reset transistor (RST) or the row select transistor (RS).

2. The double-layer stacked CMOS image sensor according to claim 1, wherein
   a bottom side of the second substrate (SB2) is bonded to the top side of the first substrate (SB1).

3. The double-layer stacked CMOS image sensor according to claim 1, wherein
   longitudinal projections of the first floating diffusion region (FD1) and the second floating diffusion region (FD2) (FD1) have an overlap region.

4. The double-layer stacked CMOS image sensor according to claim 1, wherein
   the source follow transistor (SF), the reset transistor (RST), and the row select transistor (RS) are laterally arranged and formed on the second substrate (SB2).

5. The double-layer stacked CMOS image sensor according to claim 1, wherein
   the second floating diffusion region (FD2) is located on lateral circumference of the source follow transistor (SF) and the reset transistor (RST).

6. The double-layer stacked CMOS image sensor according to claim 1, wherein
   a signal processing logic circuit (LC) of the image sensor is formed on the second substrate (SB2).

* * * * *